United States Patent
Lau et al.

(10) Patent No.: US 6,291,924 B1
(45) Date of Patent: Sep. 18, 2001

(54) ADJUSTABLE SAW DEVICE

(75) Inventors: Kei-Fung Lau, Rolling Hills Estates; Robert B. Stokes, Rancho Palos Verdes; Kuo-Hsiung Yen; Alvin M. Kong, both of Manhattan Beach; Steven E. Housholder; Ronald D. Kasparek, both of Torrance, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/346,081

(22) Filed: Jul. 1, 1999

(51) Int. Cl.[7] .................................................. H01L 41/08
(52) U.S. Cl. ................... 310/313 R; 310/313 B
(58) Field of Search ........................... 310/313 R, 313 B, 310/334; 333/150–155

(56) References Cited

U.S. PATENT DOCUMENTS

| | | | |
|---|---|---|---|
| 3,446,974 | * 5/1969 | Seiwatz ......................... | 310/313 B X |
| 3,446,975 | * 5/1969 | Adler et al. .................. | 310/313 B X |
| 3,745,564 | * 7/1973 | Gandolfo et al. ............ | 310/313 B X |
| 3,903,486 | * 9/1975 | Bert et al. ...................... | 310/313 R X |
| 3,962,652 | * 6/1976 | Zarin et al. ................... | 310/313 R X |
| 4,056,803 | * 11/1977 | White et al. .................. | 310/313 R X |
| 4,209,725 | * 6/1980 | Dieulesaint et al. ............. | 310/334 X |
| 5,115,160 | * 5/1992 | Knoll et al. .................. | 310/313 R X |
| 5,144,262 | * 9/1992 | Hunsinger ..................... | 310/313 R X |

OTHER PUBLICATIONS

"MEMS Programmable Universal Processor", Dr. Rob Stokes, Proposal Abstract, Dated: Nov. 20, 1997.

* cited by examiner

*Primary Examiner*—Mark O. Budd
(74) *Attorney, Agent, or Firm*—Connie M. Thousand

(57) ABSTRACT

An adjustable surface acoustic wave (SAW) transducer is fabricated on a piezoelectric substrate. The adjustable SAW transducer includes a plurality of SAW interdigital transducer (IDT) fingers disposed on the substrate. Miniature switches are used to provide a plurality of interconnection patterns between the SAW IDT fingers such that a plurality of SAW characteristics can be generated from a single set of SAW IDT fingers.

30 Claims, 15 Drawing Sheets

ADJUSTABLE SAW DEVICE

BACKGROUND OF THE INVENTION

1. Field of the Invention

The present invention relates to a Surface-acoustic wave (SAW) device for modifying and passing a signal and, more particularly, to a SAW device which includes switches for providing connections to selected SAW Interdigital Transducer (IDT) fingers of the SAW device producing a plurality of SAW characteristics from a common set of SAW IDT fingers.

2. Description of the Prior Art

Referring to FIG. 1, a typical SAW device 10 includes an input transducer 12 and an output transducer 14. Each input 12 and output 14 transducer has a plurality of SAW IDT fingers 16 formed on a substrate 18. Interconnections between selected SAW IDT fingers 16 are provided by connecting each SAW IDT finger 16 to either a first 20, second 22, third 24 or fourth 26 sum line. A radio-frequency (RF) signal voltage 28 is applied between the first 20 second 22 sum lines which provide the voltages 28 to the SAW IDT fingers 16 of the input transducer 12 creating strains in the piezoelectric substrate 18. If the strains occur with the proper periodic pattern across the length of the SAW device 10, an acoustic surface wave will be generated. The spacing between SAW IDT fingers 16, the interconnection pattern of the SAW IDT fingers 16, and the frequency content of the applied voltage difference determines the magnitude and phase of the surface acoustic wave. The acoustic wave which is launched by this input transducer 12 travels to the output transducer 14, where it is converted to an output electrical signal. If the SAW IDT fingers 16 have the proper spacing and are connected to the sum lines 20–26 with the proper interconnection pattern, a SAW device 10 having a desired signal modification in the time and frequency domains will be generated.

SAW devices 10 formed on a piezoelectric substrate 18 are typically metal film formed from photolithography and thin film processes with either etching or lift-off techniques. These techniques are typically required since the width of each SAW IDT finger 16 and the spacing between adjacent SAW fingers 16 are on the micron or submicron level. For typical prior art SAW devices 10, the SAW IDT fingers 16 and the sum lines 20–26 are formed on the substrate 18 resulting in the SAW fingers 16, the sum lines 20–26 and the interconnection pattern between SAW IDT fingers 16 being fixed on the substrate 18. Since the SAW IDT fingers 16 and sum lines 20–26 are fixed on the substrate 18, the typical prior art SAW device 10 provides only a single interconnect pattern between SAW fingers 16 and can generate a surface acoustic wave only with fixed signal modifications in the time and frequency domains. If a different surface acoustic wave is desired, a new SAW device having a new interconnect pattern must be fabricated.

One method used to provide for more than one signal modification is to fabricate a plurality of SAW transducers on a single substrate. Then, the input or output signal can be switched among several transducers each of which provides different properties. The drawback of this method is that it gives only a small amount of flexibility and requires more space on the substrate. Therefore, what is needed is a SAW device which can provide a plurality of signal modification properties from a common set of SAW IDT fingers such that the resulting SAW device properties can be changed without the need to fabricate a new SAW device.

SUMMARY OF THE INVENTION

The aforementioned need in the prior art is satisfied by this invention, which provides an adjustable SAW device.

An adjustable SAW device, in accordance with the invention, comprises a plurality of SAW IDT fingers formed on a substrate where the SAW IDT fingers together define one set of SAW IDT fingers. Means to provide a plurality of interconnection patterns between selected SAW IDT fingers is provided whereby the plurality of interconnection patterns can be provided from the one set of SAW IDT fingers.

For a first embodiment of the invention, a plurality of miniature switches are positioned on the substrate and are coupled together by a plurality of sum lines. The switches are controlled by a plurality of control lines.

For a second embodiment of the invention, the adjustable SAW device is an adjustable filter utilized for a variety of applications.

DETAILED DESCRIPTION OF THE INVENTION

Figure 2:
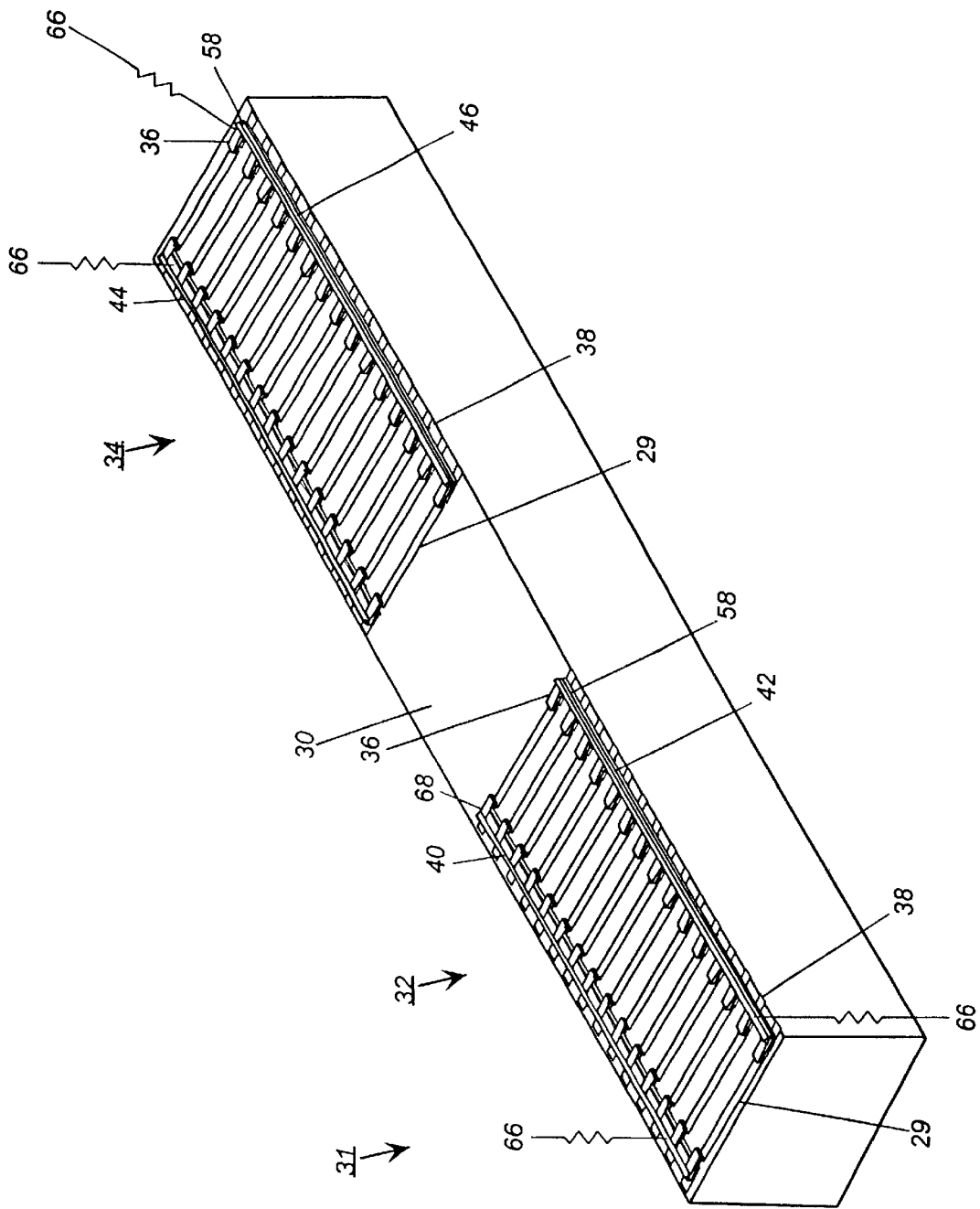
FIG. 2 is an isometric view of an adjustable SAW device in accordance with the present invention.

Referring now to FIG. 2, the present invention overcomes the limitation of the prior art by providing a plurality of SAW IDT fingers 29 disposed on a substrate 30. The SAW IDT fingers 29 together comprise a single set of SAW fingers. Means are provided to produce a plurality of interconnection patterns between preselected SAW IDT fingers 29 whereby a plurality of interconnection patterns can be provided from the single set of SAW IDT fingers.

The present invention provides an adjustable SAW device 31 which includes an input 32 and output 34 SAW transducer. The input 32 and output 34 SAW transducers each include a plurality of SAW IDT fingers 29, miniature switches 36, control lines 38 and sum lines 40–46. The miniature switches 36 are attached to the sum lines 40–46 and provide the means to interconnect selected SAW IDT fingers 29. The miniature switches 36 also provide the means to vary the interconnect pattern between selected SAW IDT fingers 29. The switches 36 can be opened or closed as desired to provide a plurality of interconnect patterns between selected SAW IDT fingers 29 thereby creating a plurality of time and frequency domain signal modifications in a single SAW device 31 thereby creating a multiplicity of SAW device characteristics from a single SAW device 31.

Figure 3:
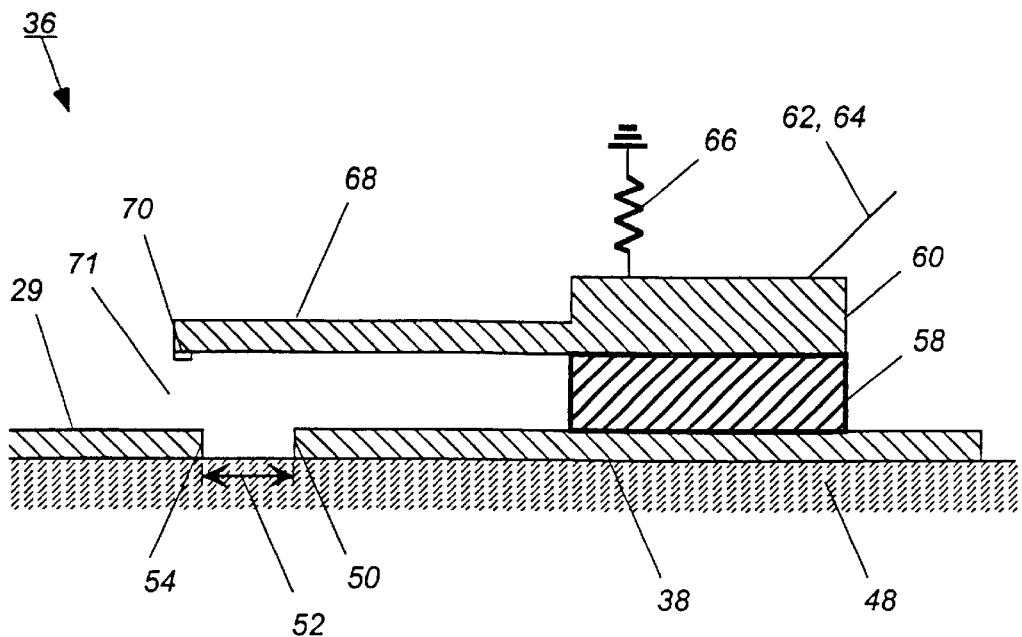
FIG. 3 is a side plan view of a single miniature switch in an open circuit position.
Figure 4:
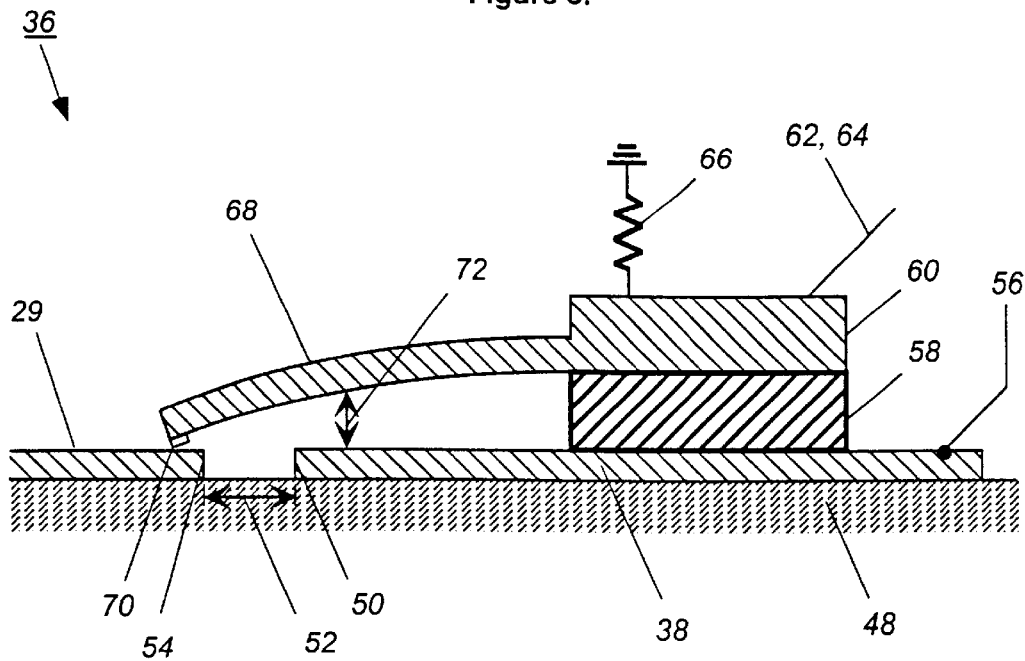
FIG. 4 is a side plan view of a single miniature switch in a closed circuit position.

Referring to FIGS. 3 and 4, a side view of a single miniature switch 36 in accordance with the preferred embodiment of the invention is shown in FIG. 3 for the open circuit state and FIG. 4 for the closed circuit state. As shown in FIGS. 3 and 4, a single switch 36 includes a control line 38 formed on the piezoelectric substrate 48. The control line end 50 is located at a preselected distance 52 from the end 54 of the SAW IDT finger 29. The control line 38 is adapted to receive a control voltage 56.

A dielectric layer 58, formed of insulating material such as silicon dioxide, silicon nitride, aluminum oxide, polyamide or the like, is attached to the control line 38. A plate 60 is formed of electrically conductive material and is attached to the dielectric layer 58. The dielectric layer 58 provides an electrical separation between the control line 38 and the plate 60. For an input transducer 32 (FIG. 2), the plate 60 (FIG. 3) is adapted to receive an RF signal 62 from an RF signal line. For an output transducer 34 (FIG. 2), the plate 60 (FIG. 3) provides the signal 64 to an RF signal line.

DC return-to-ground means 66 is attached to the plate 60 and provides a DC rectum-to-ground while maintaining a high impedance to block out the RF signal. The DC return-to-ground means 66 is preferably a resistor 66 having a high ohmic value. Preferably, the ohmic value of the resistor 66 is at least an order of magnitude higher than the impedance of the RF signal line. Alternatively, the DC return-to-ground means 66 can be an RF choke in the form of an inductor. However, a resistor is preferred because it will typically be much smaller and lower cost than an inductor.

A flexible cantilever arm 68 is formed integrally with the plate 60, but it could also be a separate component physically connected to the plate 60. For the preferred embodiment of the invention, the cantilever arm 68 is formed of an electrically conductive material such as aluminum. For an alternative embodiment, the arm 68 is formed of a non conductive material, such as silicon coated with a conductive material such as aluminum.

A good electrical connection between the cantilever arm 68 and the SAW IDT finger 29 is desirable. As such, the cantilever arm 68 can include a metalized switch contact 70. This switch contact 70 consists of a pad of electrically conductive material attached to the cantilever arm 68 facing the SAW finger 35. The pad 70 is made of a highly conductive metal such as gold, platinum or gold palladium, for example, that does not oxidize easily and can also be plated with a gold film to provide a highly conductive, non-corrosive contact.

As shown in FIG. 3, in the open position, the cantilever arm 68 extends over a portion of the control line 38, over the first gap 52 and over a portion of the SAW IDT finger 29 and forms a second gap 71 with the SAW IDT finger 29. As shown in FIG. 4, application of a DC voltage 56 to the control line 38 creates an electrostatic force 72. The electrostatic force 72 causes the portion of the cantilever arm 68 that is above the control line 38 to flex towards the SAW finger 29. The electrostatic force 72 causes the cantilever arm 68 to touch the SAW IDT finger 35 closing the second gap 71 (FIG. 3) and creating an electrical closed circuit between the SAW IDT finger 29 and the cantilever arm 68.

As shown in FIG. 3, removing the DC voltage 56 from the control line 38 removes the electrostatic force 72 (FIG. 4) which causes the cantilever arm 68 to restore its original shape and cease electrical contact with the SAW IDT finger 29 providing an electrical open circuit between the SAW IDT finger 29 and the cantilever arm 68.

In the preferred embodiment, shown in FIG. 2, a plurality of switches 36 are utilized for a single SAW device 31. For this embodiment, each SAW IDT finger 29 has two switches 36, one located at each end of each SAW IDT finger 29. A separate control line 38 formed on the piezoelectric substrate 48 is provided for each switch 36. Each control line 38 is adapted to receive a separate DC voltage. Four dielectric layers 58 are provided which are each formed of insulating material. Each dielectric layer 58 is attached to a plurality of control lines 38. Four sum bars 40–46 are formed of electrically conductive material with each sum bar 40–46 being attached to a separate dielectric layer 58. The first 40 and second 42 sum bars are adapted to receive an RF signal. DC return-to-ground means 66 are attached to each sum bar 40–46. Cantilever arms 68 are electrically connected to each sum bar 40–46. Applying a DC voltage to selected control lines 38 closes only select switches 36 providing a first interconnect pattern between the SAW fingers 29 of the SAW device 31. Selectively varying the application of DC voltages to selected control lines 38 varies the interconnect pattern between the SAW IDT fingers 29 of the SAW device 31 providing a unique signal modification in the time and frequency domains with each combination of closed and open switches 36.

If desired, the interconnection pattern of the adjustable SAW device 31 can be configured remotely by placing the adjustable SAW device 31 in a remote controlled system such that when a control signal is transmitted to and received by the remote control system, the remote control system provides a DC signal to the proper control lines 38 closing the desired switches 36. This is particularly useful in satellite applications where the control signals are generated on the ground and transmitted to the satellite.

The present invention has the capability to interconnect all or only some of the SAW IDT fingers 29 which in essence provides the capability to skip some of the SAW IDT fingers 29. An interconnect pattern which skips some of the SAW IDT fingers 29 is representative of a conventional SAW interconnect pattern which is useful for a lower frequency than that created by providing interconnections between all SAW IDT fingers 29.

Figure 5:
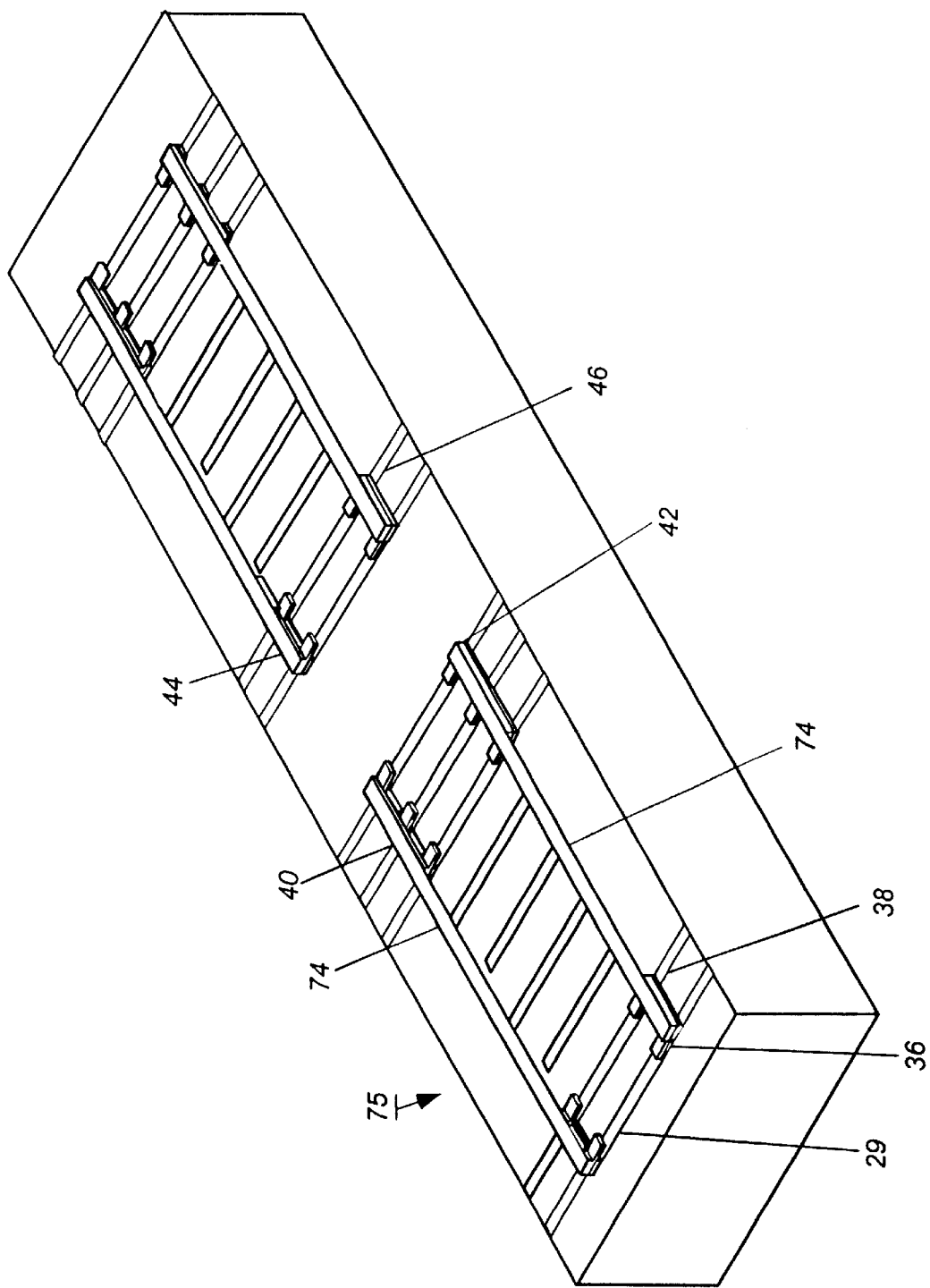
FIG. 5 is an isometric view of an adjustable SAW device in accordance with a first embodiment of the present invention.

Referring to FIG. 5, a first embodiment of the invention combines switches 36 and direct attachments 74 of the SAW IDT fingers 29 with the sum lines 40–46 in a single SAW device 75. This embodiment provides a partly adjustable SAW device 75 which uses fewer switches 36 and control lines 38 than the embodiment previously described but still provides for a great degree of flexibility.

Figure 6:
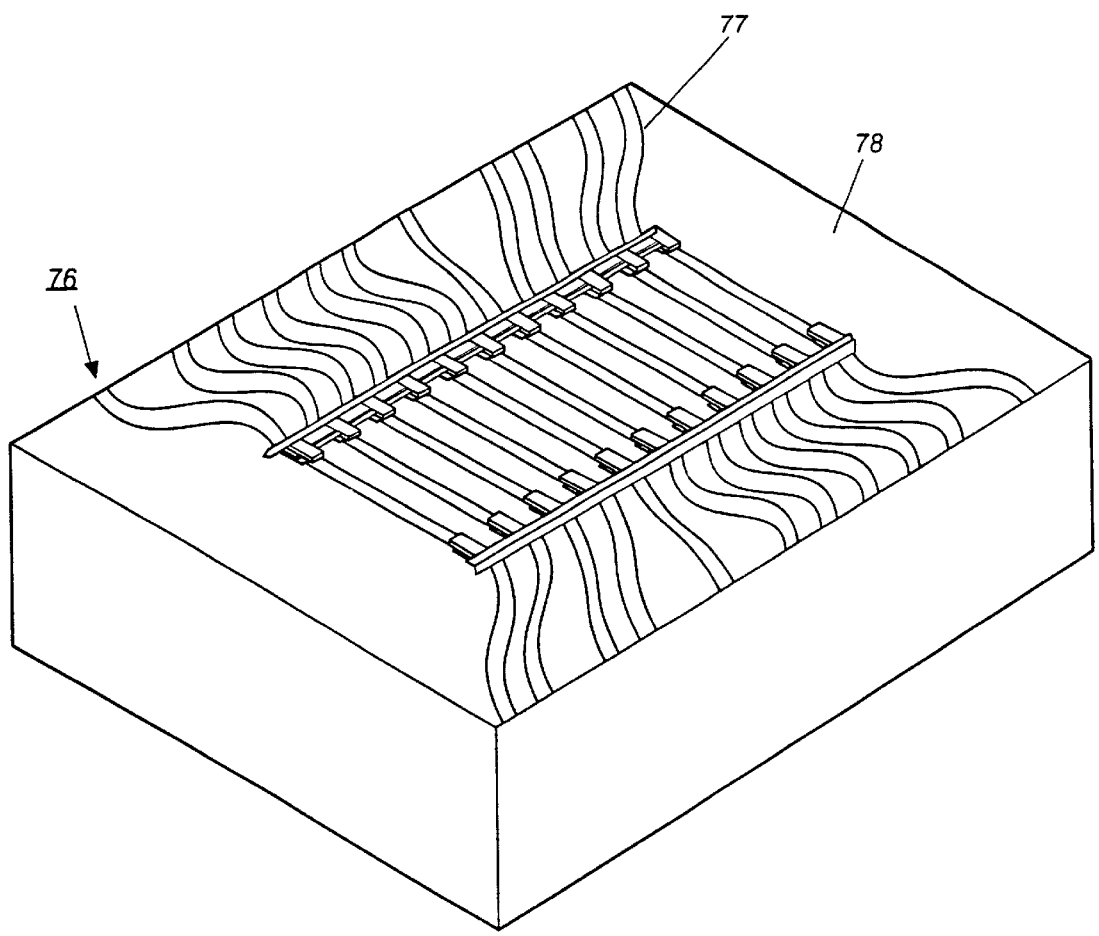
FIG. 6 is an isometric view of a portion of an adjustable SAW device in accordance with a second embodiment of the present invention.

Referring to FIG. 6, a portion 76 of a SAW device is shown for a second embodiment of the invention in which the control lines 77 are dispersed on a substrate 78 such that the spacing between adjacent control lines 77 is progressively increased. This embodiment can simplify the fabrication of the adjustable SAW device since the control lines 77 and spacing between control lines 77 can be widened as the control lines 77 disperse in the substrate 78 simplifying adaptation of the control lines 77 for receiving a DC voltage.

Figure 7:
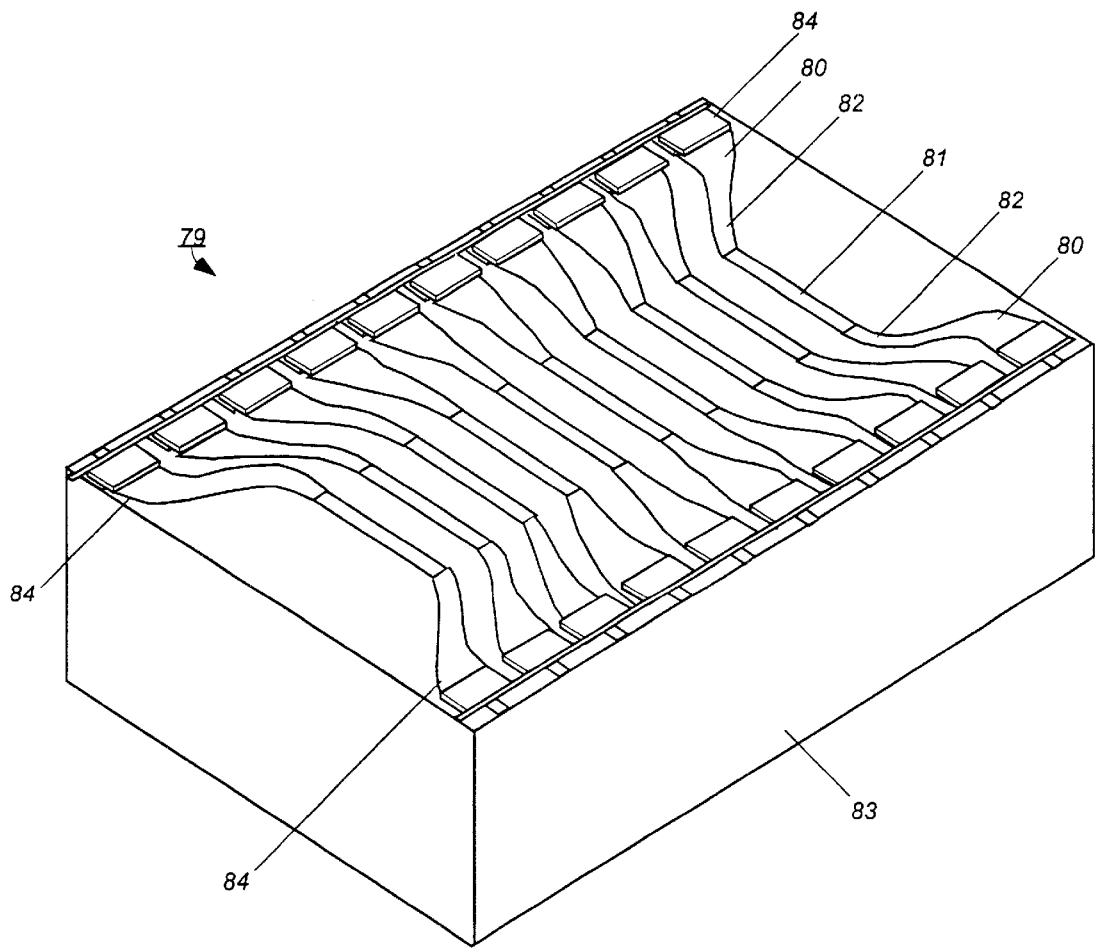
FIG. 7 is an isometric view of a portion of an adjustable SAW device in accordance with a third embodiment of the present invention.

Referring to FIG. 7, a portion 79 of a SAW device is shown for a third embodiment of the invention in which a plurality of metal traces 80 are electrically coupled to the SAW IDT fingers 81. The metal traces 80 are coupled to the SAW IDT fingers 81 at a first end 82 and disperse in the substrate 83. The spacing between adjacent metal traces 80 increases with dispersion of the metal trace 80 in the substrate 83 so that the width of each metal trace 80 can be increased from the first end 82 to the second end 84 of each metal trace 80. For this embodiment, a switch 84 is located at each end 84 of each metal trace 81. Coupling metal traces 80 to the SAW IDT fingers 81 and dispersing the metal traces 80 in the substrate 82 simplifies fabrication of the adjustable SAW device 79 by allowing a larger separation between successive switches 84 allowing the switches 84 to be physically larger. The metal traces 80 have a minimal effect on the generation of the surface acoustic wave since the metal traces 80 disperse and are therefore not parallel and do not have the proper spacing to effectively create the surface acoustic wave.

Figure 8:
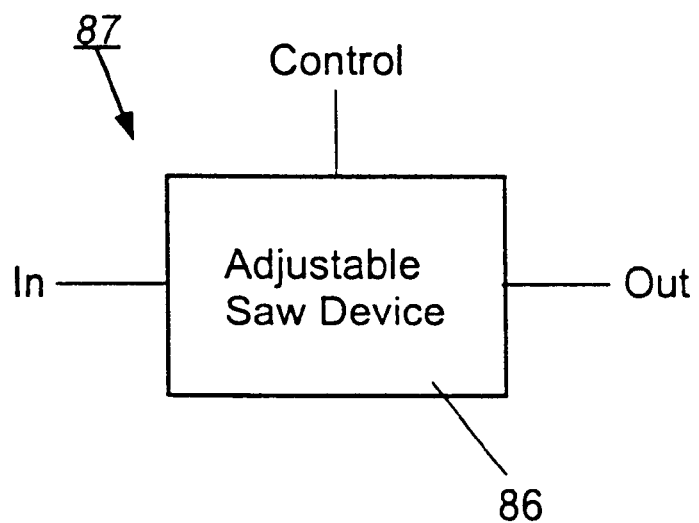
FIG. 8 is a block diagram of an adjustable SAW device configured as an adjustable filter in accordance with a fourth embodiment of the present invention.

Referring to FIG. 8, for a fourth embodiment of the invention, the adjustable SAW device 86 is configured as an adjustable filter 87 to provide a plurality of different preselected filter characteristics. By altering the open and closed states of the switches 36 (FIGS. 2–4), the adjustable SAW device 86 (FIG. 8) can be configured as a bandpass filter, a notched filter, an adaptive filter, an equalizer or any other filter known to one skilled in the art.

Figure 9:
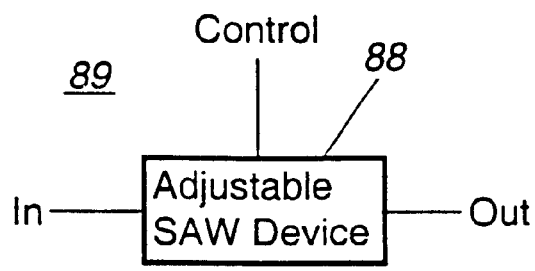
FIG. 9 is a block diagram of an adjustable SAW device configured as an adjustable bandpass filter in accordance with a fifth embodiment of the present invention.
Figure 10A:
FIGS. 10a–10c are example passband shapes which are provided by the adjustable bandpass filter of FIG. 9.
Figure 10B:
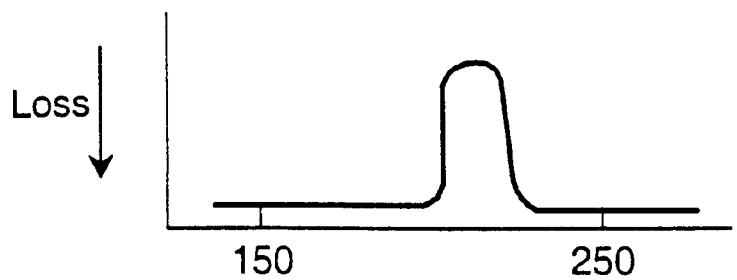
Figure 10C:
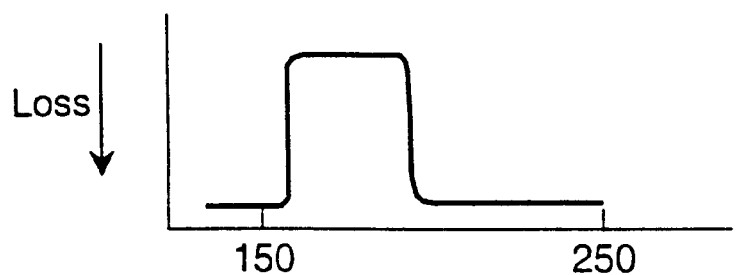

For example, referring to FIG. 9, for a fifth embodiment of the invention, the adjustable SAW device 88 is configured as an adjustable filter 89 which is programmed in phase as well as amplitude so that any selected passband shape, examples of which are shown in FIGS. 10a–10c, can be provided by the adjustable filter 89.

Figure 11:
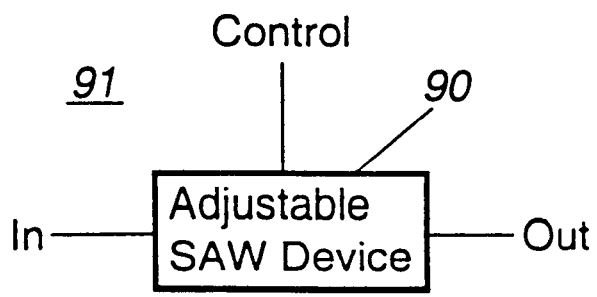
FIG. 11 is a block diagram of an adjustable SAW device configured as an adjustable notched filter in accordance with a sixth embodiment of the present invention.
Figure 12:
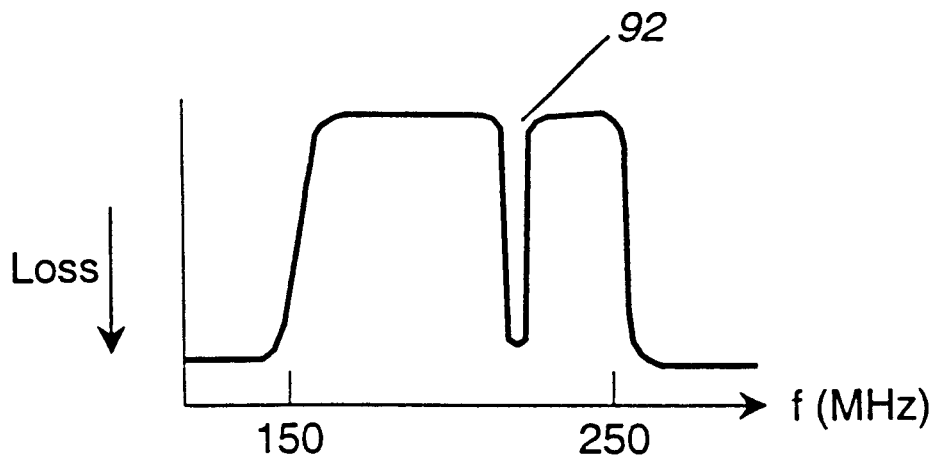
FIG. 12 is an example notch within a passband which is provided by the adjustable notched filter of FIG. 11.

Referring to FIGS. 11 & 12, for a sixth embodiment of the invention, the adjustable SAW device 90 is configured as an adjustable notched filter 91 which is configured to pass all frequencies in a selected frequency band except for selected frequencies 92, known in the art as a notch 92 within the band. One or more notches 92 can be provided from a single adjustable notched filter 91 at the same time by interconnecting the SAW fingers 36 (FIG. 2) of the adjustable SAW device 90 to provide a preselected interconnection pattern which provides the desired notches 92. These notches 92 can be altered as needed through electrical command of the switches 36 (FIG. 2) on the SAW IDT fingers 29.

Figure 13:
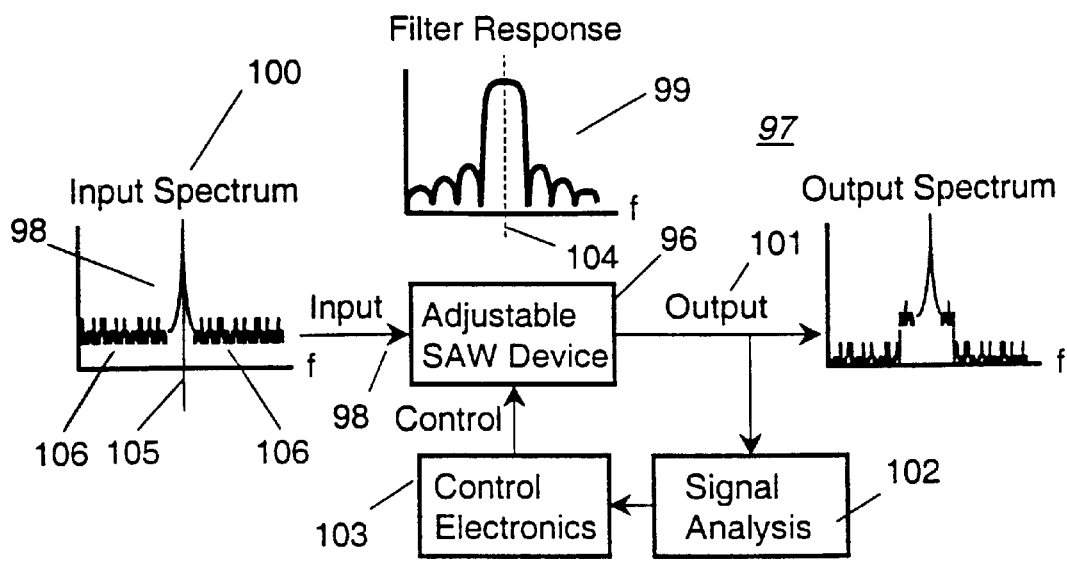
FIG. 13 is a block diagram of an adjustable SAW device configured to provide an adaptive filter in accordance with a seventh embodiment of the present invention.

Referring to FIG. 13, for a seventh embodiment of the invention, the adjustable SAW device 96 can be configured as an adaptive filter 97 which dynamically responds to, and tracks, an input signal 98. The adaptive filter 97 is configured to provide a preselected filter response 99. An input spectrum 100 containing the input signal 98 is passed through the adjustable SAW device 96 generating an output 101 which is provided to the signal analysis means 102. A feedback condition is achieved by coupling the output 101 to the filter control electronics 103.

The filter 97 is initially configured to provide for wideband operations corresponding to a low signal-to-noise ratio (SNR). The output 101 is analyzed by the signal analysis means 102 for the presence of the input signal 98. Following signal identification and characterization, the center frequency 104 of the filter response 99 is adjusted to match the center frequency 105 of the input signal 98. The bandwidth of the adjustable filter 97 is reduced to maximize the received SNR. Or, the bandwidth of the adjustable filter 97 is shaped to provide a matched filter response which is approximately matched to the electrical characteristics of the input signal 98. By providing feedback, the filter 97 can dynamically track and process the input signal 98 in a high SNR or matched detection mode.

Alternatively, the adjustable SAW device 96 can be configured to provide a narrow bandwidth, corresponding to a high SNR, or a matched filter mode. The adjustable filter 97 can be configured to provide a filter response 99 having a selected center frequency 104 to scan the input spectrum 100 for the desired signal 98. To do so, the adjustable SAW device 96 is configured as a filter element which is configured to provide selected filter response characteristics such as center frequency, bandwidth and impulse response. The adaptive filter 97 is configured to be optimized as a narrow bandpass filter around an incoming signal 98 in order to reject out-of-band noise 106 thereby maximizing the detection SNR.

Figure 14:
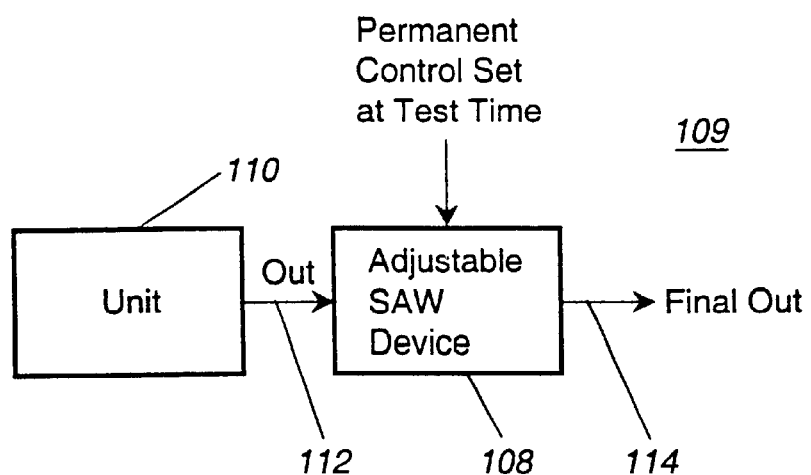
FIG. 14 is a block diagram of an adjustable SAW device configured as an electrically operated equalizer in accordance with an eighth embodiment of the present invention.
Figure 15:
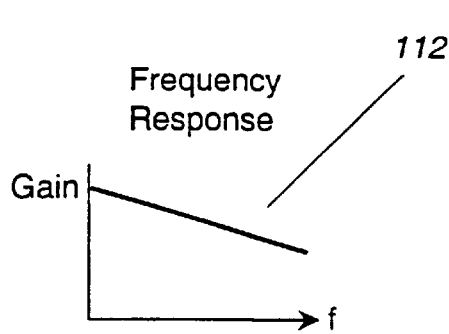
FIG. 15 is a graph of the frequency response of a resultant signal output from the unit shown in FIG. 14.
Figure 16:
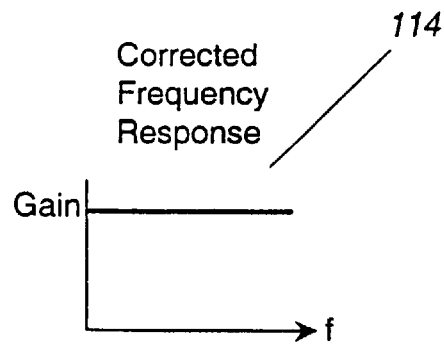
FIG. 16 is a graph of a corrected frequency response of a final output signal from the electrically operated equalizer of FIG. 14.

Referring to FIGS. 14–16, for an eighth embodiment of the invention, the adjustable SAW device 108 can be configured as an electrically operated equalizer 109. Complex microwave units 110 contain multiple electrical components, each of which can vary slightly from desired nominal electrical characteristics. When the electrical characteristics of each electrical component are combined together, the resultant signal 112 often exhibits an undesirable effect such as rolloff over a passband as shown in FIG. 15.

In prior art systems, the undesirable effects are sometimes compensated for by passing the resultant signal 112 through equalizers (not shown), which are configured to compensate for the undesirable effects and correct the shape of the passband. These prior art equalizers are usually custom designed and/or manually adjusted to provide the proper compensation for the signal 112. By replacing the prior art equalizers with a single adjustable SAW device 108 and configuring the adjustable SAW device 108 as an electrically operated equalizer 109, selected attenuation can be provided over the band to compensate for the undesirable effects. The advantage over a prior art equalizer is that the adjustable SAW equalizer 109 requires no physical adjustment and can be manufactured and installed together with the other components in the unit 110. The unit 110 and adjustable SAW device 108 can then be adjusted to provide preselected outputs and a preselected corrected frequency response 114 as shown in FIG. 16 during testing of the unit 110. This enables low-cost manufacturing along with relatively loose specifications for individual components within the unit 110, while retaining precise unit performance.

Figure 17:
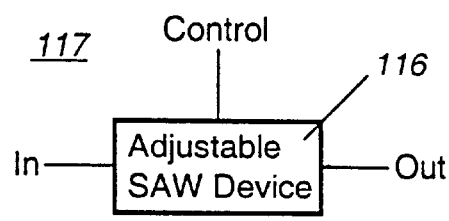
FIG. 17 is a block diagram of an adjustable SAW device configured as an adjustable filter in accordance with a ninth embodiment of the present invention.
Figure 18:
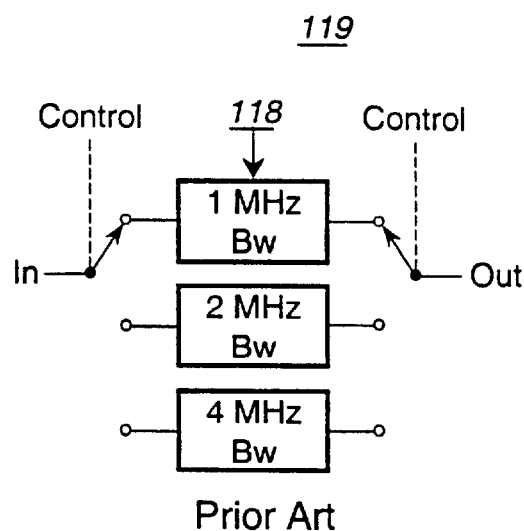
FIG. 18 shows a block diagram of a prior art filter bank disposed in a communication system.

Referring to FIGS. 17 and 18, for a ninth embodiment of the invention, the adjustable SAW device 116 is configured as an adjustable filter 117 to replace a plurality of filters 118 which are known to one skilled in the art as a bank of filters 118. Prior art communication systems 119 employ banks of either SAW bandpass filters 118 or SAW delay lines (not shown). The prior art system 119 switches to only one filter 118 or delay line at a time depending on the needs of the user. In the case of the bandpass filters 118, each filter 118 has a different bandwidth. In the case of the delay lines, the different delay lines have different time delays and durations of the impulse response.

For the present invention a single adjustable SAW device 116 is configured as an adjustable filter 117 such that a single adjustable filter 117 replaces the entire bank of filters 118. The SAW IDT fingers 36 (FIG. 2) of the adjustable SAW device 116 (FIG. 17) can be interconnected in a preselected manner to provide a desired filter characteristic at any time thereby providing size, cost and weight advantages over the prior art bank of filters 118 since multiple filters 118, of which only one is being used at a time, are replaced by a single adjustable filter 117.

In addition, while the bank of filters 118 must switch between a finite number of filters 118 each having a fixed design and fixed electrical characteristic, the adjustable filter 117 can not only be configured to provide the same electrical characteristics as that provided by the bank of filters 118, but can also be configured to provide additional preselected electrical characteristics which are not available from the bank of filters 118. For example, if the prior art filter bank 118 covers bandwidths of 1, 2 and 4 MHz, the adjustable filter 117 could be configured to provide the same bandwidths of 1,2 and 4 MHz plus additional selected bandwidths such as 0.85 MHz, 1.57 MHz, etc., thereby providing a filter 117 with increased versatility.

The adjustable filter 117 can be disposed in a satellite (not shown) and configured to be remotely programmed such that the adjustable filter 117 could be reconfigured upon receipt of a signal from the earth to provide a new filter characteristic remotely. This would provide for a plurality of new bandwidths to be transmitted to the satellite at any time during the life of the satellite.

Figure 19:
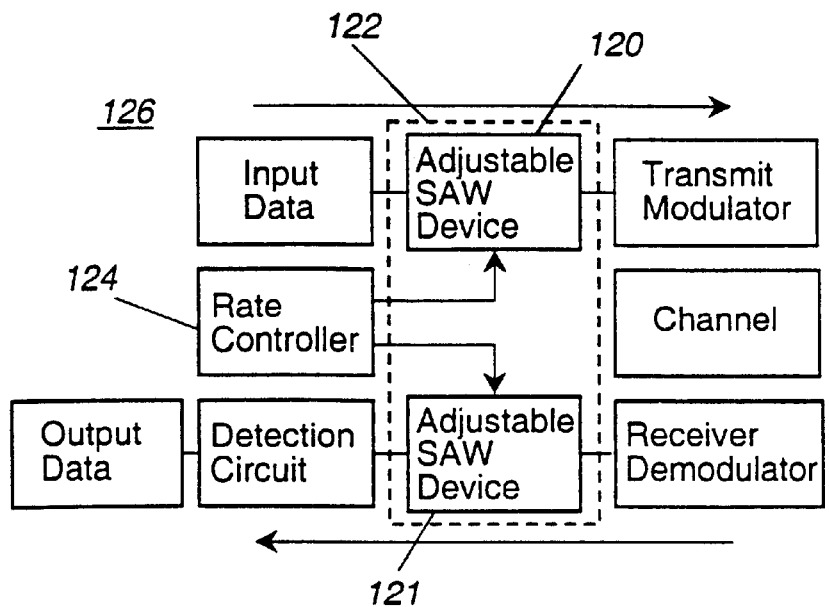
FIG. 19 is a block diagram of an adjustable SAW device configured as an adjustable rate signal processing matched filter element in accordance with a tenth embodiment of the present invention.

Referring to FIG. 19, for a tenth embodiment of the invention, a plurality of adjustable SAW devices 120,121 are configured to provide an adjustable variable rate signal processing matched filter element 122. Digital communications systems, most notably emerging wireless systems, employ spectrally efficient modulation techniques such as QPSK, OQPSK, M-PSK AND GPSK. These modulation rates all manipulate the carrier phase to convey information. To maintain the narrow bandwidths dictated by current communications, regulations necessitate a smooth carrier phase transition. This transition is usually accomplished by shaping the data pulses with either a raised cosine or gaussian filter. The receiving system contains a filter which is matched to the transmitter's filter to achieve optimum detection. As the matched filter's impulse response is a function of the data rate, different data rates dictate using different filters. A more detailed description of matched filters can be found on page 298 of the book *Surface Acoustic Wave Devices and Their Signal Processing Applications*, written by Colin Campbell and published by Academic Press, Inc., in 1989.

By configuring adjustable SAW devices 120,121 to provide an adjustable matched filter 122, a single adjustable matched filter 122 can be used to provide matched filter characteristics for a wide range of data rates by selectively configuring the response of each adjustable SAW device 120,121 for the desired data rate. With the addition of appropriate control electronics 124, a data link 126 could be constructed with a continuously variable data rate that optimizes system BER.

Figure 20:
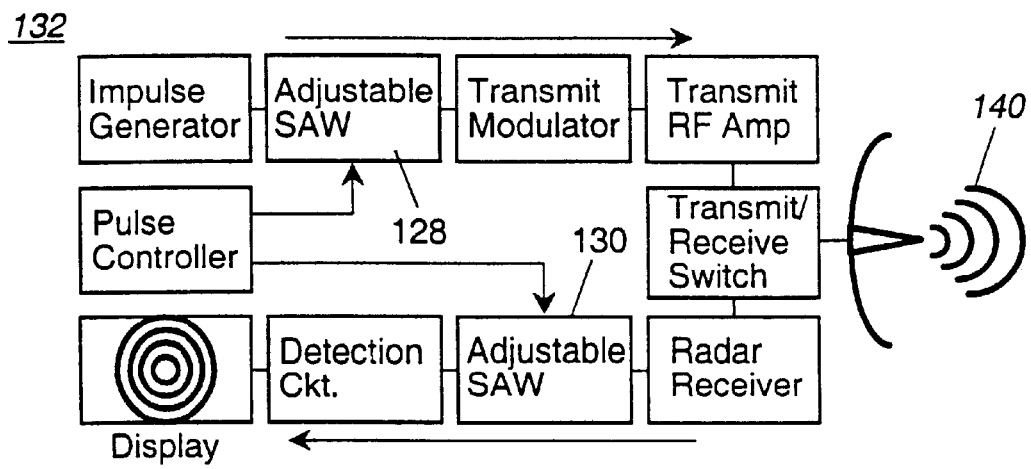
FIG. 20 is a block diagram of an adjustable SAW device configured as an anti-jam RADAR matched filter element in accordance with a ninth embodiment of the present invention.
Figure 21:
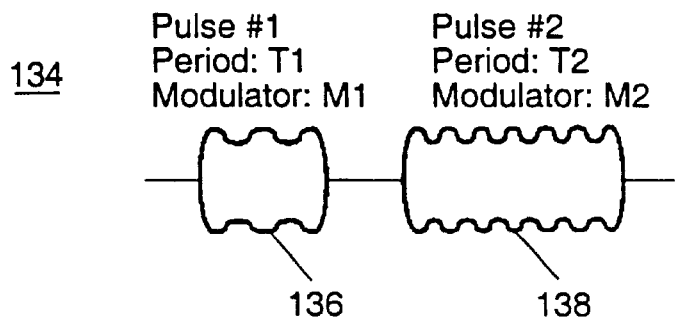
FIG. 21 shows RADAR pulses provided by the anti-jam RADAR matched filter of FIG. 20.

Referring to FIGS. 20 and 21, for an eleventh embodiment of the invention, a pair of adjustable SAW devices, 128,130 are disposed in a RADAR system 132 and are configured to provide a jam resistant RADAR matched filter. Each adjustable SAW device 128,130 is configured to create a signal 134 having a plurality of RADAR pulses 136,138 with each RADAR pulse 136,138 having a different amplitude and bandwidth characteristic. Varying the interconnect pattern of the adjustable SAW devices 128,130 varies the amplitude and bandwidth of each RADAR pulse 136,138 such that a hostile emitter(not shown) cannot gain complete knowledge of the characteristics of the transmitted signal 140 from the received pulse history and therefore cannot easily generate false returns to deceive the RADAR system 132.

Figure 22:
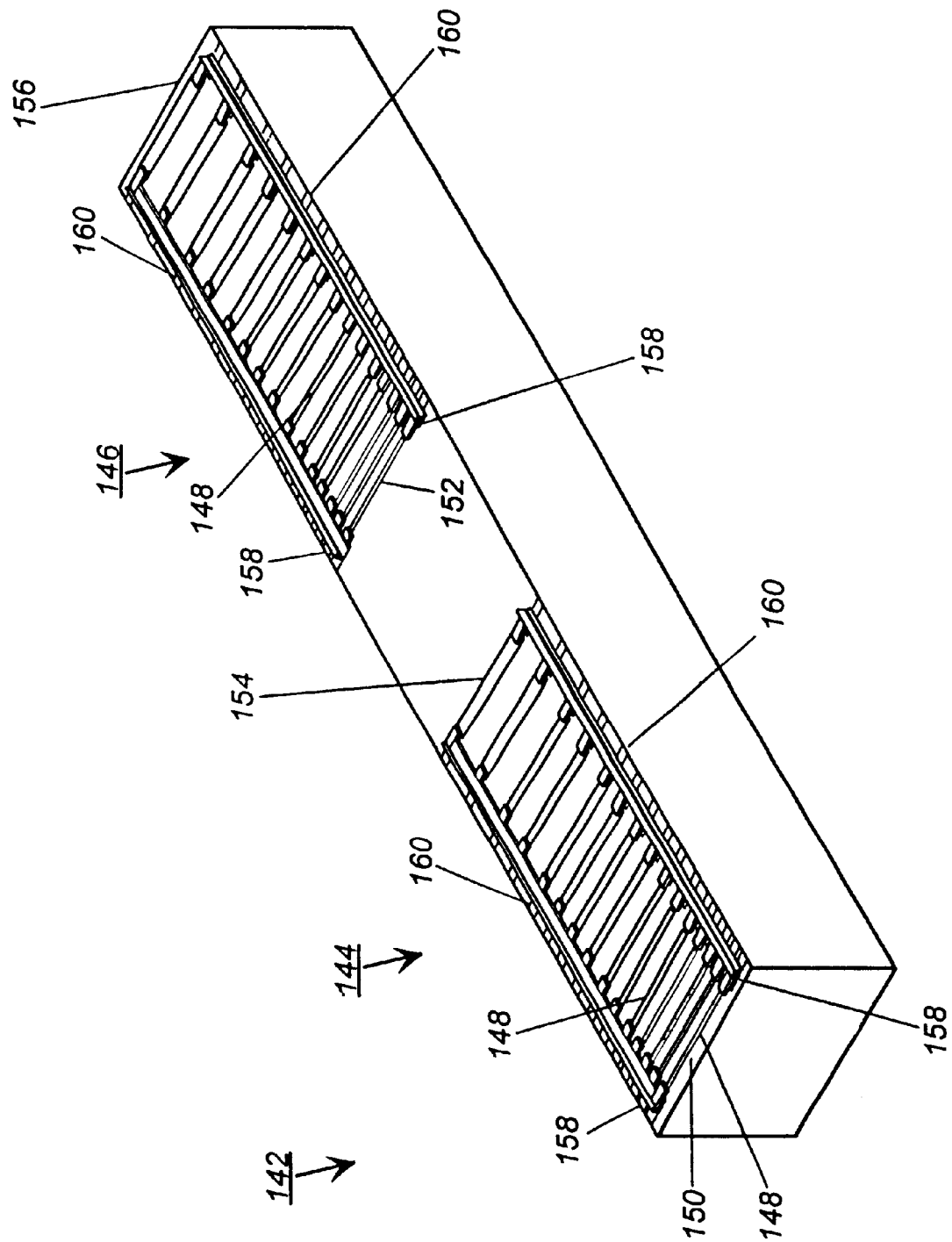
FIG. 22 is a block diagram of an adjustable SAW device configured as a chirped transducer in accordance with a twelfth embodiment of the present invention.

Referring to FIG. 22, for a twelfth embodiment of the invention, the adjustable SAW device 142 is designed and configured so that both the input 144 and output 146 transducers are chirped transducers 144,146. A more detailed discussion of chirped transducers can be found in Chapter 9, titled *The SAW Linear FM Chirp Filter* of the Surface Wave Acoustic Wave Devices reference mentioned above. The transducers 144,146 are configured to have closely spaced narrow fingers 148 at the left ends 150,152 of both transducers 144,146 respectively, and then increasing finger width and spacing between fingers 148 toward a maximum at the right ends 154,156 of both transducers 144,146 respectively.

In chirped transducers, only a small group of properly spaced fingers 148 are effective at any particular frequency. The highest frequency waves will propagate from the left end 150 of the input transducer 144 to the left end 152 of the output transducer 146, and the lowest frequency waves will propagate from the right end 154 of the input transducer 144 to the right end 156 of the output transducer 146. Similarly, waves of intermediate frequency propagate between intermediate points in the transducers 144,146. If the transducers 144,146 are identical, the delay is constant for all frequencies even though different regions of the transducers 144,146 are effective at different frequencies.

The switches 158 are used to connect only the fingers 148 associated with the frequencies which are desired to pass through the transducer 144,146. For example, if each finger 148 in each transducer 144,146 is connected to alternating sum bars, the chirped transducer 142 will have a wide filter passband characteristic. On the other hand, if a small group of fingers 148 are connected to alternating sum bars at the left end 150 of the input transducer 144; and, if a small group of fingers 148 are connected to alternating sum bars at the left end 152 of the output transducer 146, the chirped transducer 142 will have a narrowband high frequency filter characteristic. The chirped transducer 142 can be adjusted by means of the switches 158 and control lines 160 to take on characteristics which provide passbands having preselected center frequencies and bandwidths, stopbands having a preselected width and frequency, as well as preselected multiple passbands.

Figure 23:
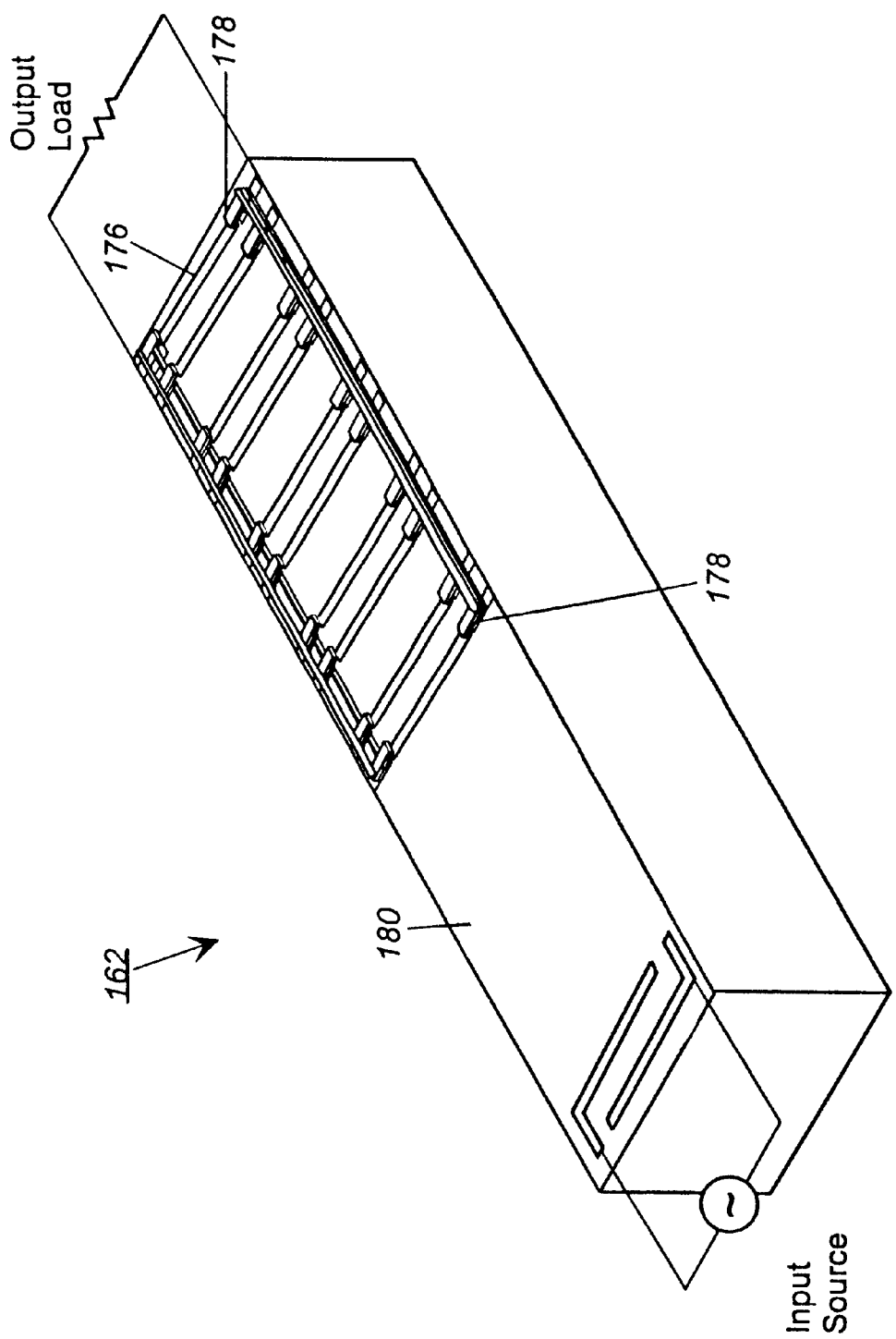
FIG. 23 is a schematic drawings of an adjustable SAW device configured as an adjustable programmable tapped delay line in accordance with a thirteenth embodiment of the present invention; and, FIG. 24 is a schematic drawing of a prior art programmable tapped delay line.
Figure 24:
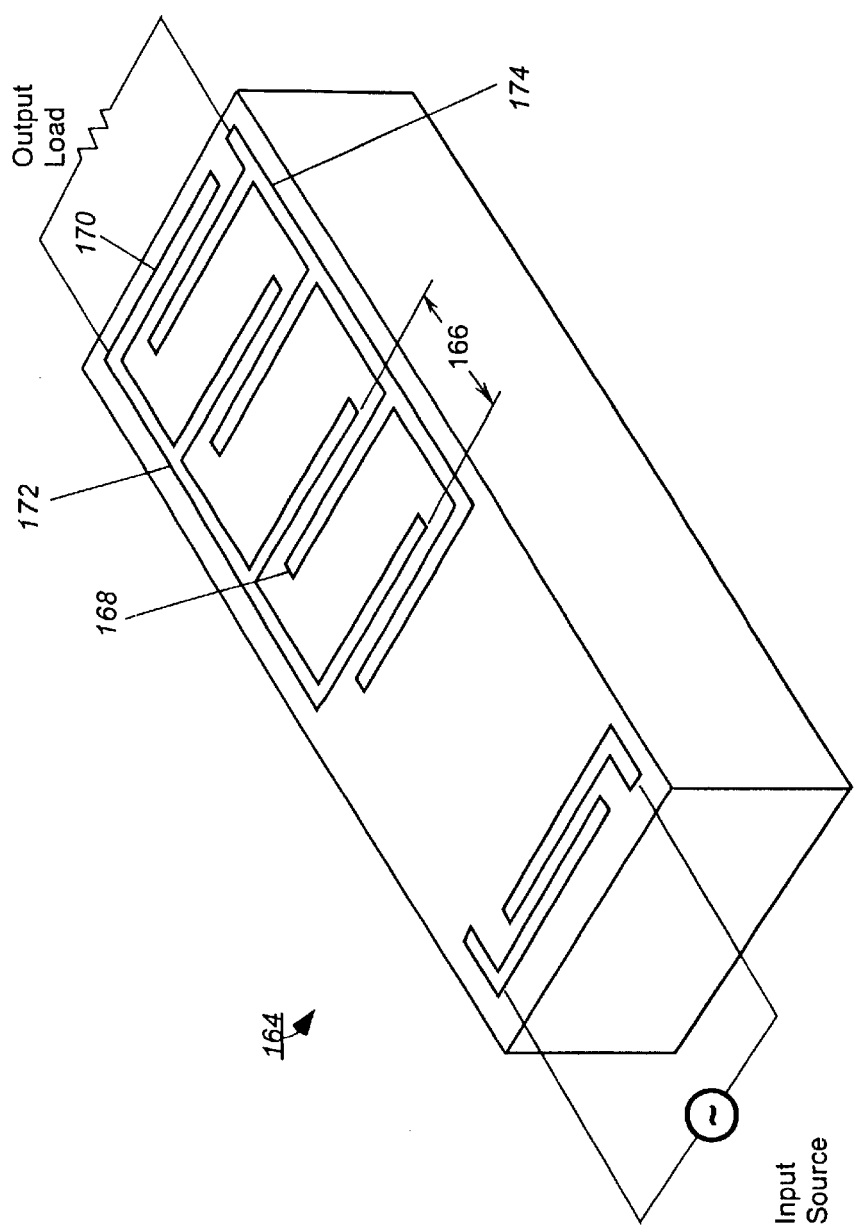

Referring to FIGS. 23 & 24, for a thirteenth embodiment of the invention, the adjustable SAW device 162 is configured to provide an adjustable programmable tapped delay line 162. The typical prior art SAW tapped delay line 164 is a SAW device which adds together signals over a sequence of equally spaced 166 delays 168. The individual sub-transducers 170 at each delay 168 are known in the art as taps 170. If the taps 170 are interconnected to the sum lines 172,174 with the proper interconnect pattern, the tapped delay line 164 can be used as a correlator for a phase-coded signal. If the tapped delay line 164 is implemented in a traditional prior art SAW device where all the fingers and interconnection are formed on the substrate as shown in FIG. 24, the electrical characteristics of the tapped delay line 164 are permanently fixed. To solve this problem, field effect transistors (FETs, not shown) can be used to switch the phase of the taps 170 and control the amplitude of the taps 170 allowing the phase of the taps 170 to be switched and the amplitude of the taps 170 to be changed as desired. However, the field effect transistor must be made of a semiconductor material (not shown) and mounted with or near the taps 170 to facilitate connection to each tap 170. By configuring an adjustable SAW device 162 as a programmable adjustable tapped delay line 162, switching of the phase of the taps 176 can be provided without the need for FETs. The switches 178 can be fabricated directly on the SAW substrate 180 simplifying assembly and RF connection problems.

Figure 1:
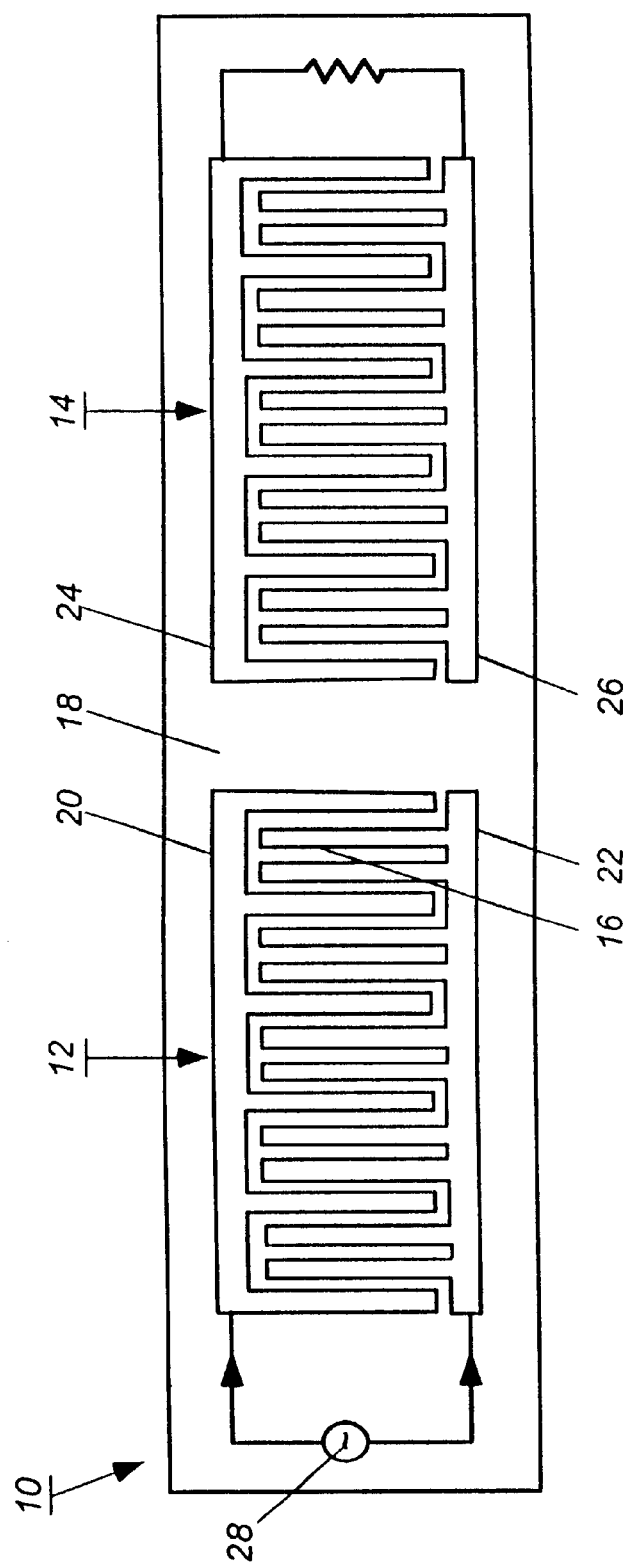
FIG. 1 is a top plan view of a typical SAW device.

Referring back to FIG. 2, the adjustable SAW device 31 utilizes switches 36 to provide an interconnect pattern between selected SAW fingers 29 and vary that interconnect pattern as desired allowing a plurality of time and frequency domain characteristics out of a single SAW device 31 thereby overcoming the fixed characteristics limitations of a typical SAW device 10 (FIG. 1). One or more adjustable SAW devices 31 (FIG. 2) can be disposed in a variety of systems, such as communication systems, and can be configured as adjustable or adaptive filters to replace a bank of filters thereby saving weight, cost and space.

It will be appreciated by persons skilled in the art that the present invention is not limited to what has been shown and described hereinabove. The scope of the invention is limited solely by the claims which follow.

We claim as our invention:

1. An adjustable surface acoustic wave (SAW) device comprising:
   a piezoelectric substrate;
   a plurality of SAW interdigital transducer (IDT) fingers formed on said substrate, the SAW IDT fingers together comprising one set of SAW IDT fingers; and,
   a plurality of mechanical switches disposed on said substrate and configured to provide a plurality of interconnection patterns between selected SAW IDT fingers, each mechanical switch being selectively controllable between an open and a closed state, said open and closed states of each of the mechanical switches together defining each of the interconnection patterns, selectively changing said open and closed state of each of the mechanical switches providing said plurality of interconnection patterns, whereby said plurality of mechanical switches comprises:
   a plurality of control lines formed on said substrate, each control line positioned distal each SAW IDT finger;
   a plurality of electrically conductive flexible arms; and
   a plurality of DC return-to-ground means coupled to each said flexible arm,
   each flexible arm being electrostatically attractable toward each control line upon application of a DC voltage on each control line, selective application of said DC voltage causing selected flexible arms to form said closed state, selective removal of said DC voltage causing selected flexible arms to form said open state, selectively varying said application of said DC voltages selectively varying said open and closed states of each switch.

2. An adjustable SAW device as in claim 1, wherein the open and closed states of the switches are remotely programmable.

3. An adjustable SAW device as in claim 1, wherein said adjustable SAW device is configured as an adjustable filter.

4. An adjustable SAW device as in claim 3, wherein said adjustable SAW device is configured as an adjustable notched filter.

5. An adjustable SAW device as in claim 3, wherein said adjustable SAW device is configured as an adjustable bandpass filter.

6. An adjustable SAW device as in claim 1, wherein said adjustable SAW device is configured as an electrically operated equalizer.

7. An adjustable SAW device as in claim 1, wherein said adjustable filter is disposed in a RADAR system, said adjustable filter configured to generate a RADAR signal having preselected RADAR pulses, each RADAR pulses having an amplitude and a bandwidth adjustable by selectively changing said open and closed states of said switches.

8. An adjustable SAW device as in claim 7, wherein said adjustable SAW device is configured as an anti-jam RADAR matched filter.

9. An adjustable SAW device as in claim 1, wherein said adjustable SAW device is configured as an adaptive filter.

10. An adjustable SAW device as in claim 1, wherein said adjustable SAW device is configured as an adjustable rate signal processing matched filter element.

11. An adjustable SAW devices as in claim 1, wherein said adjustable SAW device is configured as a programmable tapped delay line.

12. An adjustable SAW devices as in claim 1, wherein said adjustable SAW device is configured as a chirped transducer.

13. An adjustable SAW transducer comprising:
   a piezoelectric substrate;
   a plurality of surface-acoustic wave (SAW) interdigital transducer (IDT) fingers formed on said substrate, each said SAW IDT finger having two ends; and
   a plurality of switches selectively changeable between an open state and a closed state, said plurality of switches comprising:
   a plurality of control lines formed on said substrate each said control line positioned such that a first gap is formed between each said control line and one of the ends of each said SAW IDT finger;

a plurality of dielectric layers, one each attached to a preselected number of said control lines;

a plurality of electrically conductive plates, each attached to one of the dielectric layers;

a plurality of DC return-to-ground means coupled to each said plate;

a plurality of electrically conductive flexible cantilever arms attached to said plates, each said cantilever arm extending over one said first gap and partially over a portion of one of the control lines forming a plurality of second gaps between said cantilever arms and said SAW IDT fingers;

said portion of each cantilever arm above said control line being electrostatically attractable toward said control line upon application of a DC voltage on each said control line, selective application of said DC voltage causing selected cantilever arms to make electrical contact with selected SAW fingers to close selected second gaps between said selected cantilever arms and said selected SAW IDT fingers whereby said selected cantilever arms and said selected SAW fingers form said closed state, selective removal of said DC voltage causing selected cantilever arms to cease electrical contact with selected SAW IDT fingers whereby said selected cantilever arms and said selected SAW IDT fingers form said open state, selectively varying said application of said DC voltages selectively varying said open and closed states of each switch.

14. An adjustable SAW transducer as in claim 13, further comprises a plurality of metal traces formed on said substrate, each said metal trace having a first and a second end, said first end of each metal trace electrically coupled to one end of each SAW IDT finger, said metal traces dispersing in the substrate so that the spacing between adjacent metal traces increases from said first end to said second end wherein each said first gap is formed between one control line and said second end of one metal trace.

15. An adjustable SAW transducer as in claim 14, wherein each metal trace has a width which increases monotonically with said dispersion of each metal trace in the substrate.

16. An adjustable SAW transducer as in claim 13, wherein each said control line comprises a first end and a second end, said first end disposed closer to said SAW IDT fingers than said second end, said control lines disperse in said substrate such that said spacing between said control lines increases between said first and second ends.

17. An adjustable SAW transducer as in claim 13, wherein said adjustable SAW transducer is remotely programmable.

18. An apparatus for detecting and recovering a transmit signal comprising:

a first adjustable filter disposed in a transmit system configured to transmit said transmit signal, said first adjustable filter comprising:
 a first piezoelectric substrate;
 a plurality of first SAW IDT fingers disposed on said first substrate; and,
 a plurality of first mechanical switches disposed on said first substrate and configured to provide a plurality of first interconnection patterns between selected first SAW IDT fingers, said plurality of first mechanical switches comprising:
  a plurality of first control lines formed on said first substrate, each first control line positioned such that a first gap is formed between each first control line and each first SAW IDT finger;
  a plurality of first electrically conductive flexible arms a portion of which extends over the first SAW IDT fingers forming a plurality of second gaps between the first flexible arms and the first SAW IDT fingers; and
  a plurality of first DC return-to-ground means coupled to each first flexible arm,
  said portion of each first flexible arm above each first control line being electrostatically attractable toward said first control line upon application of a first DC voltage on each first control line, selective application of said first DC voltage causing selected first flexible arms to form said closed state, selective removal of said first DC voltage causing selected flexible arms to form said open state, selectively varying said application of said first DC voltages selectively varying said open and closed states of each first mechanical switch; and a second adjustable filter disposed in a receive system and configured to detect and recover said transmit signal, said second adjustable filter comprising:
 a second piezoelectric substrate;
 a plurality of second SAW IDT fingers disposed on said second substrate; and,
 a plurality of second mechanical switches disposed on said second substrate and configured to provide a plurality of second interconnection patterns between selected second SAW IDT fingers, said plurality of second mechanical switches comprising:
  a plurality of second control lines formed on said second substrate, each second control line positioned such that a third gap is formed between each second control line and each second SAW IDT finger;
  a plurality of second electrically conductive flexible arms a portion of which extends over the second SAW IDT fingers forming a plurality of fourth gaps between the second flexible arms and the second SAW IDT fingers; and
  a plurality of second DC return-to-ground means coupled to each second flexible arm,
  said portion of each second flexible arm above said second control line being electrostatically attractable toward said second control line upon application of a second DC voltage on each second control line, selective application of said second DC voltage causing selected second flexible arms to form said closed state, selective removal of said second DC voltage causing selected second flexible arms to form said open state, selectively varying said application of said second DC voltages selectively varying said open and closed states of each second mechanical switch, said first and second interconnection patterns configured so that said first and second adjustable filters are matched filters, whereby signal detection and recovery of said transmit signal can be optimally achieved.

19. An adjustable SAW device as in claim 13, wherein the open and closed states of the switches are remotely programmable.

20. An adjustable SAW device as in claim 13, wherein said adjustable SAW device is configured as an adjustable filter.

21. An adjustable SAW device as in claim 13, wherein said adjustable SAW device is configured as an adjustable notched filter.

22. An adjustable SAW device as in claim 13, wherein said adjustable SAW device is configured as an adjustable bandpass filter.

23. An adjustable SAW device as in claim 13, wherein said adjustable SAW device is configured as an electrically operated equalizer.

24. An adjustable SAW device as in claim 13, wherein said adjustable filter is disposed in a RADAR system, said adjustable filter configured to generate a RADAR signal having preselected RADAR pulses, each RADAR pulse having an amplitude and a bandwidth adjustable by selectively changing said open and closed states of said switches.

25. An adjustable SAW device as in claim 24, wherein said adjustable SAW device is configured as an anti-jam RADAR matched filter.

26. An adjustable SAW device as in claim 13, wherein said adjustable SAW device is configured as an adaptive filter.

27. An adjustable SAW device as in claim 13, wherein said adjustable SAW device is configured as an adjustable rate signal processing matched filter element.

28. An adjustable SAW device as in claim 13, where said adjustable SAW device is configured as a programmable tapped delay line.

29. An adjustable SAW device as in claim 13, where said adjustable SAW device is configured as a chirped transducer.

30. An apparatus for detecting and recovering a transmit signal comprising:
a first adjustable filter disposed in a transmit system configured to transmit said transmit signal, said first adjustable filter comprising:
a first piezoelectric substrate;
a plurality of first SAW IDT fingers disposed on said first substrate, the first SAW IDT fingers together comprising a first set of SAW IDT fingers and defining a SAW propagation direction, each first SAW IDT finger having a submicron to micron width dimension in the SAW propagation direction, adjacent first SAW IDT fingers being a submicron to micron distance apart in the SAW propagation direction; and,
a plurality of first mechanical switches disposed on said first substrate and configured to provide a plurality of first interconnection patterns between selected first SAW IDT fingers, each first mechanical switch having a submicron to micron width dimension in the SAW propagation direction, each first mechanical switch selectively changeable between a first open state and a first closed state, said plurality of first mechanical switches comprising:
a plurality of first control lines formed on said first substrate each first control line positioned such that a first gap is formed between each first control line and one first SAW IDT finger;
a plurality of first dielectric layers, one each attached to a preselected number of first control lines;
a plurality of first electrically conductive plates, each attached to one of the first dielectric layers;
a plurality of first DC return-to-ground means coupled to each first conductive plate;
a plurality of first electrically conductive flexible cantilever arms attached to said first conductive plates, each first cantilever arm extending over one first gap and partially over a portion of one of said first control lines forming a plurality of second gaps between said first cantilever arms and said first SAW IDT fingers,
said portion of each first cantilever arm above said first control line being electrostatically attractable toward said first control line upon application of a first DC voltage on each first control line, selective application of said first DC voltage causing selected first cantilever arms to make electrical contact with selected first SAW IDT fingers to close selected second gaps between said selected first cantilever arms and said selected first SAW IDT fingers whereby said selected first cantilever arms and said selected SAW IDT fingers form said first closed state, selective removal of said first DC voltage causing selected first cantilever arms to cease electrical contact with selected first SAW IDT fingers whereby said selected first cantilever arms and said selected first SAW IDT fingers form said first open state, selectively varying said application of said first DC voltages selectively varying said first open and first closed states of each first switch; and,
a second adjustable filter disposed in a receive system and configured to detect and recover said transmit signal, said second adjustable filter comprising:
a second piezoelectric substrate;
a plurality of second SAW IDT fingers disposed on said second substrate, the second SAW IDT fingers together comprising a second set of SAW IDT fingers, each second SAW IDT finger having a submicron to micron width dimension in the SAW propagation direction, adjacent second SAW IDT fingers being a submicron to micron distance apart in the SAW propagation direction; and,
a plurality of second mechanical switches disposed on said second substrate and configured to provide a plurality of second interconnection patterns between selected second SAW IDT fingers, each second mechanical switch having a submicron to micron width dimension in the SAW propagation direction, each second mechanical switch selectively changeable between a second open state and a second closed state, said plurality of second mechanical switches comprising:
a plurality of second control lines formed on said second substrate each second control line positioned such that a third gap is formed between each second control line and one second SAW IDT finger;
a plurality of second dielectric layers, one each attached to a preselected number of second control lines;
a plurality of second electrically conductive plates, each attached to one of the second dielectric layers;
a plurality of second DC return-to-ground means coupled to each second conductive plate;
a plurality of second electrically conductive flexible cantilever arms attached to said second conductive plates, each second cantilever arm extending over one third gap and partially over a portion of one of said second control lines forming a plurality of fourth gaps between said second cantilever arms and said second SAW IDT fingers,
said portion of each second cantilever arm above said second control line being electrostatically attractable toward said second control line upon application of a second DC voltage on each second control line, selective application of said second DC voltage causing selected second cantilever arms to make electrical contact with selected second SAW IDT fingers to close selected fourth gaps between said selected second cantilever arms and said selected second SAW IDT fingers whereby said selected second cantilever arms and said selected SAW IDT fingers form said second closed state, selective removal of said second DC voltage causing selected second cantilever arms to cease electrical contact with selected second SAW IDT fingers whereby said selected second cantilever arms and said selected second SAW IDT fingers form said second open state, selectively varying said application of said second DC voltages selectively varying said second open and second closed states of each second switch, said first and second interconnection patterns configured so that said first and second adjustable filters are matched filters, whereby signal detection and recovery of said transmit signal can be optimally achieved.

* * * * *